United States Patent [19]

Otani et al.

[11] 4,377,899

[45] Mar. 29, 1983

[54] METHOD OF MANUFACTURING SCHOTTKY FIELD-EFFECT TRANSISTORS UTILIZING SHADOW MASKING

[75] Inventors: Shunji Otani; Kenichi Kikuchi, both of Osaka, Japan

[73] Assignee: Sumitomo Electric Industries, Ltd., Osaka, Japan

[21] Appl. No.: 206,215

[22] Filed: Nov. 12, 1980

[30] Foreign Application Priority Data

Nov. 19, 1979 [JP] Japan .................... 54/149818
Nov. 20, 1979 [JP] Japan .................... 54/150444

[51] Int. Cl.³ .................. H01L 21/302; H01L 21/441
[52] U.S. Cl. ............................... 29/571; 29/578; 29/579; 29/580; 156/649; 156/653; 156/659.1; 357/152; 357/22; 357/56; 357/65; 427/84; 427/88
[58] Field of Search ............. 29/571, 578, 579, 580; 427/84, 88, 90; 156/649, 653, 659.1; 357/15, 22, 56, 58, 65

[56] References Cited

U.S. PATENT DOCUMENTS

| | | | |
|---|---|---|---|
| 3,387,360 | 6/1968 | Nakamura et al. | 29/579 |
| 3,676,732 | 7/1972 | Gabor | 29/579 X |
| 3,851,379 | 12/1974 | Gutknecht et al. | 29/579 X |
| 3,912,546 | 10/1975 | Hunsperger et al. | 29/578 X |
| 3,994,758 | 11/1976 | Ogawa et al. | 357/15 X |
| 4,048,646 | 9/1977 | Ogawa et al. | 357/15 |
| 4,222,164 | 9/1980 | Triebwasser | 29/571 |
| 4,232,439 | 11/1980 | Shibata | 29/579 |
| 4,265,934 | 5/1981 | Ladd | 427/84 |

Primary Examiner—M. J. Andrews
Assistant Examiner—W. G. Saba
Attorney, Agent, or Firm—Sughrue, Mion, Zinn, Macpeak and Seas

[57] ABSTRACT

A method for manufacturing a semiconductor transistor device, specifically a Schottky barrier gate field-effect transistor, having an excellent performance at high frequency due to an exceedingly short gate length. An electrically conductive active layer is formed on a semi-insulating semiconductor substrate. Two adjacent walls are formed on the adjacent layer, are made of resist material, and extended linearly parallel to one another. Ohmic electrode metal is then evaporated obliquely with respect to the vertical surfaces of the two walls to form an ohmic electrode layer on the active layer in areas except for that lying between the two walls. A layer of Schottky barrier metal is then deposited between the two walls, and then the two walls are removed to remove the layers of ohmic electrode metal and Schottky barrier metal on the two walls.

8 Claims, 22 Drawing Figures

4,377,899

METHOD OF MANUFACTURING SCHOTTKY FIELD-EFFECT TRANSISTORS UTILIZING SHADOW MASKING

BACKGROUND OF THE INVENTION

The present invention relates to semiconductor device manufacturing methods. More particularly, the invention relates to a semiconductor device manufacturing method which includes a step of depositing electrode metal selectively by the utilization of two adjacent walls formed on a semiconductor substrate.

A Schottky barrier gate field-effect transistor (hereinafter referred to as a "MES FET" when applicable) employs a Schottky barrier for its gate electrode which is formed by depositing metal in contact with a semiconductor surface. MES FETs are extensively employed in low-noise amplifiers, high-output amplifiers or oscillators in the range of microwave frequencies.

FIGS. 1A-1D show the manufacturing steps used in a conventional MES FET manufacturing method. As shown in FIG. 1A, an active layer 2 is formed on a semi-insulating semiconductor wafer 1 by epitaxial growth. The region of the active layer 2 is limited to a desired extent by mesa etching as seen in FIG. 1B. In FIG. 1C, a source electrode 3 and a drain electrode 4 are formed with Au-Ge-Ni alloy using ordinary vacuum evaporation and lithography techniques and thereafter the wafer is subjected to heat treatment at about 470° C. for several minutes. Then, a gate electrode 5 is formed in a region of the active layer 2 between the source electrode 3 and the drain electrode 4 using ordinary vacuum evaporation and lithography techniques.

In order to improve the high frequency response of a MES FET, it is necessary to make the gate length l as short as possible. Accordingly, the element must be manufactured with considerably high precision. In the conventional manufacturing method described above, in the formation of the pattern of the gate electrode 5 using photoresist material (hereinafter termed simply "resist"), steps are formed in the vicinity of the gate pattern by the source electrode 3 and the drain electrode 4. Accordingly, the resolution of the gate pattern is not so good as in the case that the patterns were formed on a flat surface. Thus, it is difficult to form a gate pattern as short as 1 μm with the conventional manufacturing method. In addition, while it is necessary to form the gate electrode with a high alignment accuracy on the order of ±0.2 μm between the source electrode 3 and the drain electrode 4 which were previously formed, it is considerably difficult using known techniques to locate these electrodes with such a high accuracy. Accordingly, the conventional manufacturing method provides a very low manufacturing yield.

Usually in the manufacture of devices of this type, a method is employed in which, prior to the formation of the gate electrode 5, the source electrode 3 and the drain electrode 4 are subjected to an alloying treatment to reduce the contact resistances thereto. However, if the heat treatment is carried out at a sufficiently high temperature for a long time, metal cohesion or balling-up occurs in the source and drain electrodes, which increases the magnitudes of the steps therearound. This is one of the factors which adversely affects the resolution of the gate photoresist pattern.

Accordingly, an object of the invention is to eliminate the above-described drawbacks accompanying a conventional semiconductor device manufacturing method. More specifically, an object of the invention is to manufacture short-gate MES FETs with a high yield.

SUMMARY OF THE INVENTION

The foregoing object and other objects of the invention have been achieved by the provision of a semiconductor device manufacturing method in which, according to the invention, two adjacent walls are employed and a vacuum evaporation angle is suitably selected so that electrode metal is vacuum-evaporated on desired regions only.

More specifically, this and other objects of the invention are met by a semiconductor device manufacturing method including the steps of forming an electrically conductive active layer on a semi-insulating semiconductor substrate, forming two adjacent walls on the active layer which extend linearly parallel to one another, vacuum-evaporating metal obliquely with respect to vertical surfaces of the two walls to form a layer of ohmic electrode selectively on the active layer except for areas of the active layer between the two walls, depositing a layer of Schottky barrier metal on the region of the active layer between the two walls, and removing the two walls to remove the metal which was deposited on the two walls. The walls may be formed of a resist material or a combination of resist material and an insulating material which serves as a spacer. Alternatively, the walls may be entirely of an insulating material.

Yet further, the objects of the invention are met by a semiconductor device manufacturing method including the steps of forming an electrically conductive active layer on a semi-insulating semiconductor substrate, forming two adjacent walls on the active layer extending linearly parallel to one another with each of the two walls being formed of an insulating film and a resist layer, vacuum-evaporating ohmic electrode metal obliquely with respect to the vertical surfaces of the two walls to form a layer of ohmic electrode on the active layer in areas except for areas lying between the two walls, removing the two resist layers to remove the metal formed on the resist layers, heating the layer of ohmic electrode metal, depositing a layer of Schottky barrier metal on the region of the active layer between the two insulating films, and removing each insulating film to remove the metal formed on the insulating film. The angle of vacuum evaporation for depositing the layer of Schottky barrier metal may be varied from the vertical in order to produce a shorter gate electrode. Prior to vacuum-evaporating the Schottky barrier metal, the surface of the semiconductor substrate may be etched to form a gate electrode therein. After the two walls have been formed, the surface of the semiconductor substrate may be mesa-etched

DESCRIPTION OF THE PREFERRED EMBODIMENTS

The invention will be described with reference to its preferred embodiments. A variety of materials may be used to form the walls. First, examples of a method of the invention in which resist is used to form the walls will be described.

A first example of a semiconductor device manufacturing method according to the invention will be described with reference to FIG. 2 which shows the steps of manufacturing a semiconductor device.

Figure 1A:
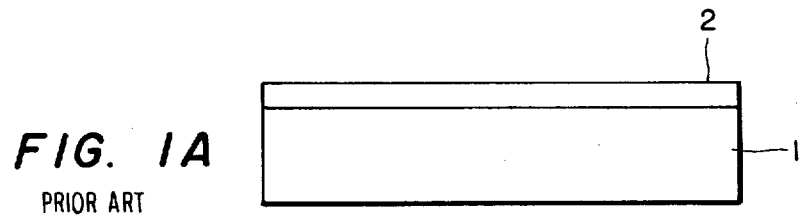
FIGS. 1A-1D are explanatory diagrams showing manufacturing steps in conventional semiconductor device manufacturing method.
Figure 1B:
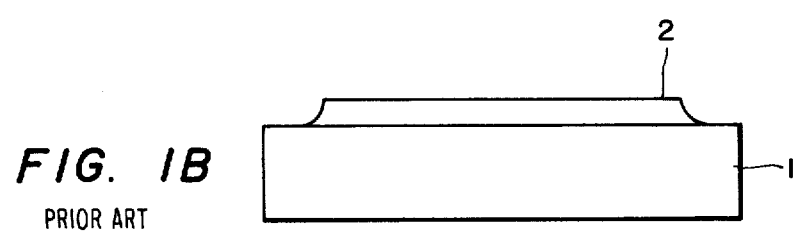
Figure 1C:
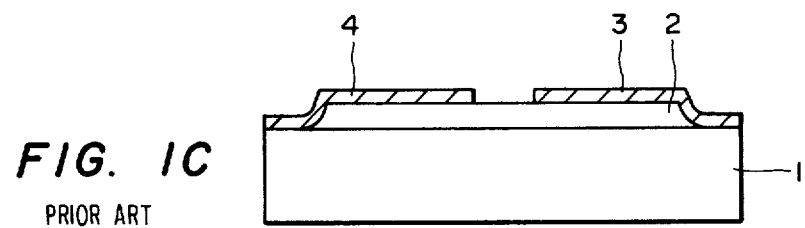
Figure 1D:
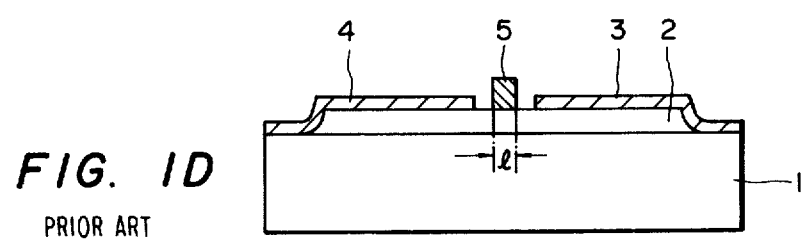
Figure 2A:
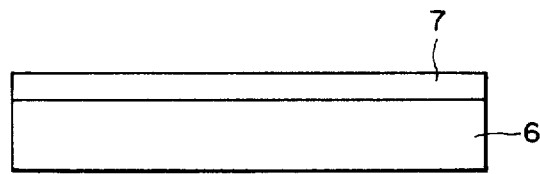
FIGS. 2A-2F and 3 are explanatory diagrams showing the manufacturing steps in a first example of a semiconductor device manufacturing method according to the invention.
Figure 2B:
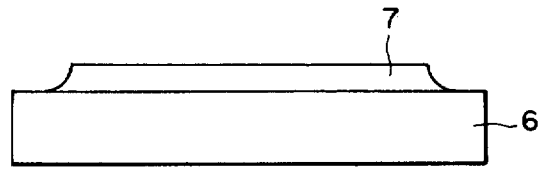

As shown in FIG. 2A, for instance an n-GaAs active layer 7 is formed on an upper surface of a semi-insulating semiconductor crystal substrate 6 such as GaAs. In this formation, a vapor-phase epitaxial growth method is preferably employed although a liquid-phase epitaxial growth method or an ion implantation method may be employed as well. Thereafter, the n-GaAs active layer 7 is limited to the desired region by mesa-etching as shown in FIG. 2B.

Figure 2C:
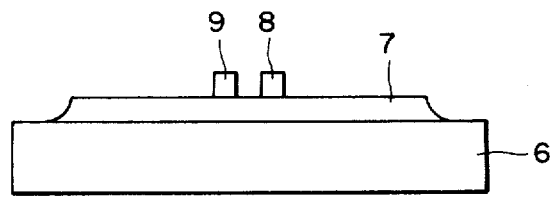

Next, resist walls 8 and 9 are formed on the active layer 7 parallel to and adjacent to each other and extending linearly on the surface of the semiconductor substrate as shown in FIG. 2C. In this case, since the surface of the active layer 7 is considerably flat, the resist walls 8 and 9 can be formed with a high precision. That is, a precise pattern can be formed to the extent of 1 μm for instance.

Figure 2D:
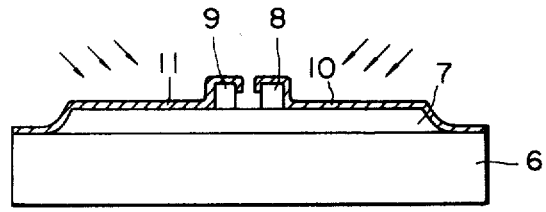

Thereafter, as shown in FIG. 2D, ohmic electrode metal such as Au-Ge-Ni alloy is vacuum-evaporated in two oblique directions to form ohmic electrode layers selectively on regions of the active layer 7 (except for a gate region) which are outside the resist walls 8 and 9, thus forming a source electrode 10 and a drain electrode 11.

In order that only the regions of the active layer 7 outside the resist walls 8 and 9 are subjected to vacuum evaporation and the region between the resist walls 8 and 9 is not so subjected, an advantageous vacuum evaporation angle must be determined. This angle can be determined by elementary geometry or from a diagram. For instance, in the case where the walls 8 and 9 are 1 μm in height and are spaced 1 μm from each other, it is necessary that the vacuum evaporation angle be more than 45° with respect to the vertical direction of the upper surface of the substrate. However, the walls are not always uniform in height and distance. Therefore, it is desirable that the vacuum evaporation angle is more than 65°.

If it is difficult to sufficiently increase the ratio of the height of the walls to the width using only the resist layer, the vacuum evaporation angle must be relatively large and accordingly the resultant layer will be smaller in thickness. This difficulty can be overcome by employing the following method. An insulating layer serving as a spacer is formed using $SiO_2$, $Si_3N_4$ or polyimide resin below the resist layer and then the insulating layer thus formed is subjected to chemical etching, plasma etching or ion etching using the resist layer as a mask to form the sufficiently high walls.

Figure 2E:
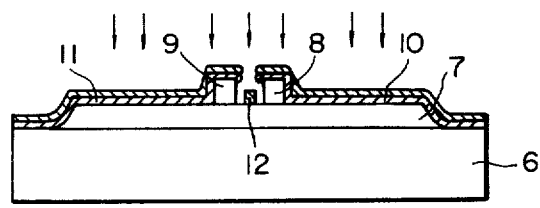

Then, as shown in FIG. 2E, Schottky barrier metal such as aluminum is vacuum evaporated substantially vertically to the surface of the substrate to form a Schottky gate electrode 12 upon the active layer 7 between the resist walls 8 and 9. In this step, aluminum is vacuum-evaporated onto the active layer 7 outside the resist walls 8 and 9 as well. However, the aluminum layers are isolated from the regions of the active layer 7 because of the presence of the Au-Ge-Ni alloy layers. That is, as the aluminum layers are merely deposited on the Au-Ge-Ni alloy layers, the ohmic characteristics thereof are changed very little.

Figure 2F:
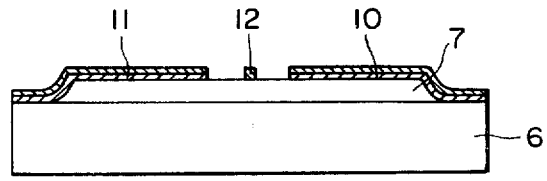

Finally, the resist walls 8 and 9 are removed and the wafer is subjected to a heat treatment at a temperature of about 470° C. for several tens of seconds to thereby obtain an excellent ohmic characteristic. The device thus formed has a MES FET structure as shown in FIG. 2F.

Figure 3:
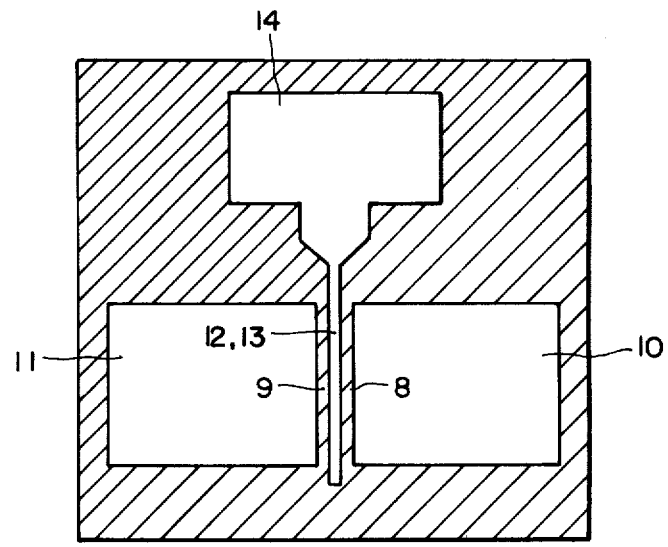

FIG. 3 shows the positional relationships of the electrodes produced in the course of manufacturing the semiconductor device as described above. In FIG. 3, the hatched portion indicates regions where the resist material is present over the active layer and reference numerals 8 and 9 designate the adjacent resist walls. Further in FIG. 3, reference numeral 13 designates a gate region. Since the gate resion 13 is surrounded by the resist walls 8 and 9, no ohmic electrode metal is deposited in the gate region 13 when the ohmic electrode metal is vacuum-evaporated at an oblique angle as described before. Two layers of ohmic electrode metal and Schottky barrier metal are formed over the entire region except the gate region 13. However, when the resist is removed, the metal layers on the resist are removed together with the resist. As a result, the source electrode 10, the drain electrode 11, the Schottky gate electrode 12, and a pad 14 coupled to the gate electrode are left with their configurations defined as shown in FIG. 3.

Figure 4:
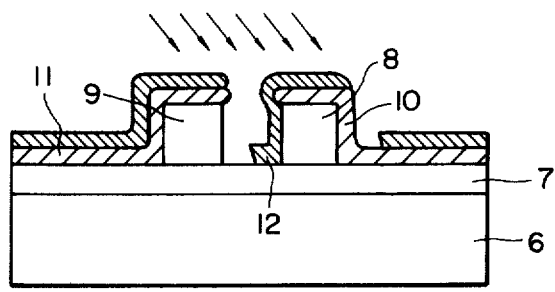
FIGS. 4 and 5 are explanatory diagrams showing second and third examples of a method according to the invention.

A second example of a method according to the invention is illustrated in FIG. 4. In this example, the vacuum evaporation angle of Schottky barrier metal is controlled to obtain a gate length which is shorter than the distance between resist walls 8 and 9. The vacuum evaporation angle is varied freely to the extent that a Schottky gate electrode 12 is formed upon the surface of an active layer 7 which is located between the resist walls 8 and 9 whereby a MES FET can be manufactured whose gate length is significantly shorter than can be obtained using ordinary lithography techniques.

Figure 5:
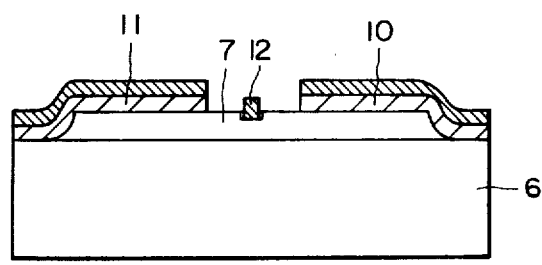

FIG. 5 is a sectional view for a description of another example of a method according to the invention.

As is apparent from the above description, the semiconductor device manufacturing method according to the invention is quite broad in its application and can be changed or modified in various manners. For instance, if, after the step of vacuum evaporating the ohmic electrode metal outside the resist walls 8 and 9 (FIG. 2D) has been accomplished, a step of lightly etching the exposed surface of the active layer 7 between the resist walls 8 and 9 is carried out. In that case, in the resulting structure, as shown in FIG. 5, only the portion of the active layer 7 which is under the Schottky gate electrode 12 is reduced. The MES FET thus formed is advantageous in that its source series resistance is small.

Figure 6A:
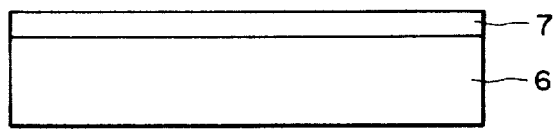
FIGS. 6A-6I are explanatory diagrams showing the manufacturing steps in a fourth example of a method according to the invention.

Another example of a method according to the invention, in which two layers, namely, a resist layer and an insulating layer are employed for forming the walls, will be described with reference to FIG. 6. As shown in FIG. 6A, first, an n-GaAs active layer 7 is formed on one surface of a semi-insulating GaAs substrate 6, for instance by a vapor-phase epitaxial growth method, to a thickness of 0.2 μm with a carrier density of $1 \times 10^{-17}$ cm$^{-3}$, for instance. In this growth, the dopant material, may, for instance be Te.

Figure 6B:
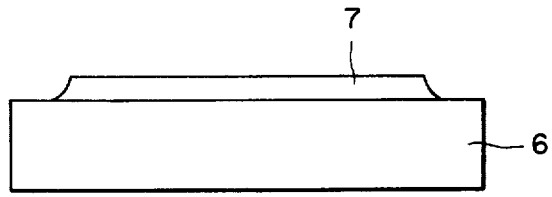
Figure 6C:
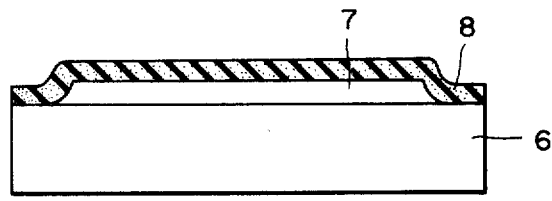

As shown in FIG. 6B, the region of the active layer 7 is defined as desired. Then, an insulating layer 8 such as a SiO$_2$ layer is formed upon the active layer 7 with a low temperature CVD method using SiH$_4$ gas. The thickness of the SiO$_2$ layer 8 is, for instance, 5000 Å.

Figure 6D:
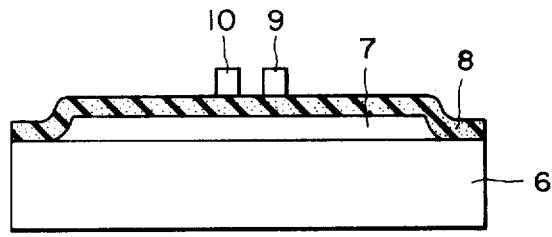
Figure 6E:
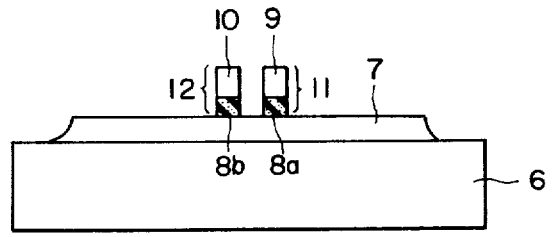
Figure 6F:
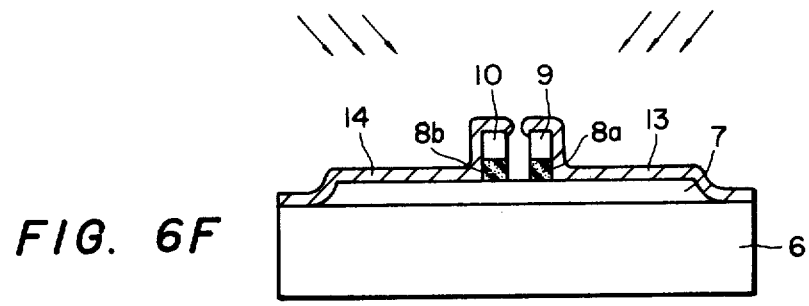

Thereafter, as seen in FIG. 6D, positive type photoresist is coated over the SiO$_2$ layer 8 to a thickness of 5000 Å and resist patterns 9 and 10 are formed using conventional techniques as shown in FIG. 6D. The photoresist patterns 9 and 10 extend in a linear pattern on the surface of the semiconductor substrate and are spaced from each other by 1 μm for instance. The patterns thus formed have an excellent resolution because they are formed on a flat surface.

Then, the SiO$_2$ layer 8 is etched with the resist patterns as a mask, so that two adjacent walls 11 and 12 composed of the remaining SiO$_2$ layers 8a and 8b and the resist patterns 9 and 10 are formed. In this example, electrode metal is vacuum-evaporated selectively by utilizing the two walls 11 and 12 as described below.

Figure 6G:
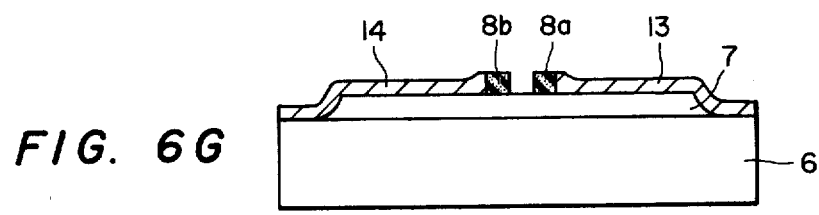

First, in order to form a source electrode 13 and a drain electrode 14, an ohmic electrode metal such as Au-Ge-Ni alloy is vacuum-evaporated obliquely onto the substrate surface to form layers of Au-Ge-Ni alloy upon the active layer 7 outside the two walls 11 and 12. Next, as shown in FIG. 6G, the resist patterns 9 and 10 are removed thereby also removing the Au-Ge-Ni alloy layers on the resist patterns 9 and 10. The semiconductor device thus formed is subjected to a heat treatment at 470° C. for about two minutes in H$_2$ atmosphere thereby improving the ohmic characteristics of the source electrode 13 and the drain electrode 14.

Figure 6H:
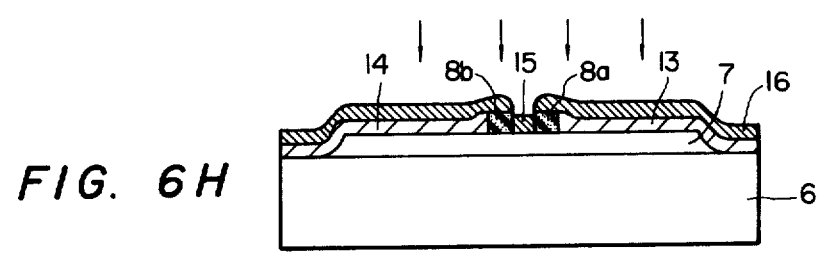

Thereafter, as shown in FIG. 6H, Schottky barrier metal such as aluminum is vacuum-evaporated over the entire surface of the element, thus an aluminum layer is formed upon the active layer 7 between SiO$_2$ layers 8a and 8b to form a Schottky gate electrode 15. In this step, aluminum layers are formed outside the SiO$_2$ layers 8a and 8b. However, as the aluminum layers are merely deposited on top of the Au-Ge-Ni alloy layers, they do not greatly affect the ohmic characteristics thereof.

Figure 6I:
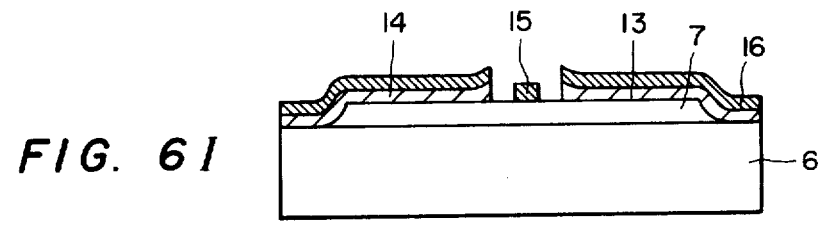

In order to more positively electrically insulate the electrodes of the semiconductor device and to increase the manufacturing yield, the following method may be employed. The SiO$_2$ layers 8a and 8b are removed by etching with an ordinary buffer etchant. As a result, the aluminum layers 16 on the SiO$_2$ layers 8a and 8b are also removed thus providing a MES FET having a sectional structure as shown in FIG. 6I.

According to this example, the ohmic contact of the drain is subjected to a heat treatment before the formation of the Schottky gate. Therefore, without affecting the electrical characteristics of the Schottky gate, the heat treatment can be carried out at a high temperature for a long period of time, and the ohmic characteristics of the resulting device are excellent. Furthermore, no additional step of forming resist patterns is required after the source electrode 13 and the drain electrode 14 have been heat-treated. Accordingly, even if balling up were to occur in the source and drain electrodes as a result of the heat treatment, the accuracy of the following precise processing would not be affected. Thus, the source and drain electrode metal can be subjected to heat treatment satisfactorily and the ohmic characteristics are improved.

In accordance with the invention, as described above, two adjacent resist walls are provided on the semiconductor layer and the vacuum evaporation angle is suitably selected so that the electrode metal is vacuum evaporated onto desired regions only. Accordingly, the source, drain and gate electrodes are formed self aligned. Thus, the method according to the invention is advantageous in that the manufacturing procedure is simple because no alignment procedure is necessary. Furthermore, since the resist patterns are formed on a flat surface, the resolution of the resist pattern is considerably high. This is another advantage of the method of the invention. Accordingly, MES FETs having a short gate length can be readily manufactured with a high yield. Thus, the method of the invention can be effectively applied to the manufacture of MES FETs or integrated circuits including MES FETs.

In the above-described examples, the semiconductor material is GaAs. However, it may be InP or another suitable semiconductor material. In addition, the Schottky barrier metal is not limited to aluminum and may be Ti, Cr, Mo or Ta. Also, the insulating film is not limited to SiO$_2$ and may be a polyimide resin film or a compound film.

What is claimed is:

1. A semiconductor device manufacturing method comprising the steps of:
    forming an electrically conductive active semiconductor layer on a semi-insulating semiconductor substrate;
    forming two adjacent walls of masking material on said active layer extending linearly parallel to one another, each of said two walls comprising an upper portion and a lower portion between said upper portion and said active layer;
    vacuum evaporating ohmic electrode metal obliquely with respect to vertical surfaces of said two walls to form a layer of ohmic electrode metal on said active layer except for a region of said active layer between said two walls;
    removing said upper portions to remove said layer of ohmic electrode metal formed on each upper portion;
    depositing a layer of Schottky barrier metal on said region of said active layer between said two lower portions; and
    removing each lower portion to remove said layer of Schottky barrier metal formed on each lower portion.

2. The method as claimed in claim 1, wherein said step of depositing said layer of Schottky barrier metal comprises vacuum evaporating Schottky barrier metal at an oblique angle with respect to said walls such that said Schottky barrier metal is deposited on less than the entire region of said active layer lying between said walls.

3. The method as claimed in claim 1, wherein prior to the step of depositing said layer of Schottky barrier metal, at least a portion of said region of said active layer is etched to form a depression into which said Schottky barrier metal is deposited to form a gate electrode.

4. The method as claimed in claim 1, in which the surface of said semiconductor active layer is mesa etched prior to the formation of said two adjacent walls.

5. The method as claimed in claim 1, wherein said upper and lower portions comprise different materials.

6. The method as claimed in claim 5, wherein each of said upper portions comprises a resist material and each of said lower portions comprises an insulating film.

7. The method as claimed in claim 1, further comprising the step of heating said layer of ohmic electrode metal prior to said step of depositing said Schottky barrier metal.

8. A semiconductor device manufacturing method comprising the steps of:

forming an electrically conductive active semiconductor layer on a semi-insulating semiconductor substrate;

forming two adjacent walls of masking material on said active layer which extend linearly parallel to one another each of said walls comprising a resist material portion and an insulating material portion serving as a spacer;

vacuum-evaporating ohmic electrode metal obliquely with respect to vertical surfaces of said two walls to form a layer of ohmic electrode metal selectively on said active layer except for a region of said active layer between said two walls;

depositing a layer of Schottky barrier metal on said region of said active layer between said two walls; and removing said two walls to remove said layers of ohmic electrode metal and Schottky barrier metal formed on said two walls.

* * * * *